United States Patent
Hwang et al.

(10) Patent No.: US 8,309,219 B2
(45) Date of Patent: Nov. 13, 2012

(54) MULTI-FUNCTION TAPE FOR A SEMICONDUCTOR PACKAGE AND METHOD OF MANUFACTURING A SEMICONDUCTOR DEVICE USING THE SAME

(75) Inventors: Yong Ha Hwang, Uiwang-si (KR); Jae Hyun Cho, Uiwang-si (KR); Gyu Seok Song, Uiwang-si (KR); Chang Beom Chung, Uiwang-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 308 days.

(21) Appl. No.: 12/881,577

(22) Filed: Sep. 14, 2010

(65) Prior Publication Data
US 2010/0330780 A1 Dec. 30, 2010

Related U.S. Application Data

(63) Continuation of application No. PCT/KR2009/001264, filed on Mar. 13, 2009.

(30) Foreign Application Priority Data

Mar. 14, 2008 (KR) .................. 10-2008-0024027

(51) Int. Cl.
*H01L 21/48* (2006.01)
*H01L 21/78* (2006.01)
*B32B 7/12* (2006.01)

(52) U.S. Cl. ........ 428/354; 438/464; 438/113; 438/118; 257/E21.599; 257/783

(58) Field of Classification Search .................. 438/464, 438/113, 118; 257/783, E21.599; 428/354
See application file for complete search history.

(56) References Cited

U.S. PATENT DOCUMENTS

| | | | | |
|---|---|---|---|---|
| 5,981,391 A * | 11/1999 | Yamada | ...................... | 438/690 |
| 6,007,920 A * | 12/1999 | Umehara et al. | ........... | 428/473.5 |
| 6,174,578 B1 * | 1/2001 | Holley | .......................... | 428/40.1 |
| 6,425,971 B1 * | 7/2002 | Silverbrook | .................. | 156/230 |
| 6,444,310 B1 * | 9/2002 | Senoo et al. | ................... | 428/354 |
| 6,580,674 B1 * | 6/2003 | Nishiyama et al. | ....... | 369/112.01 |
| 6,733,880 B2 * | 5/2004 | Tanabe et al. | ............. | 428/355 R |
| 6,787,929 B2 * | 9/2004 | Yoshihara et al. | ............ | 257/792 |
| 6,865,798 B2 * | 3/2005 | Fukuroi | ..................... | 29/603.07 |
| 6,873,059 B2 * | 3/2005 | Amagai et al. | ................ | 257/783 |

(Continued)

FOREIGN PATENT DOCUMENTS
JP 2005-116610 A 4/2005
(Continued)

*Primary Examiner* — Mary Wilczewski
(74) *Attorney, Agent, or Firm* — Lee & Morse, P.C.

(57) ABSTRACT

A multifunction tape for a semiconductor package and configured to bond to a device-formed side of a semiconductor substrate having a plurality of devices thereon while performing a process of grinding a side of the semiconductor substrate opposite to the device-formed side and a process of dicing the semiconductor substrate into individual chips with a dicing tape having a UV-curable adhesive layer bonded to the ground side of the semiconductor substrate, the multifunction tape being bonded to the individual chips while the individual chips, separated from each other by the dicing process, are picked up and die-attached and a method of manufacturing a semiconductor device using the same, the multifunction tape including a base film; a UV-curable adhesive layer on one side of the base film; and first and second bonding layers on the adhesive layer.

16 Claims, 8 Drawing Sheets

U.S. PATENT DOCUMENTS

| | | | |
|---|---|---|---|
| 7,041,190 B2 * | 5/2006 | Ookawa | 156/268 |
| 7,101,620 B1 * | 9/2006 | Poddar et al. | 428/354 |
| 7,112,467 B2 * | 9/2006 | Eichelberger et al. | 438/106 |
| 7,244,465 B2 * | 7/2007 | Kondou et al. | 427/162 |
| 7,452,752 B2 * | 11/2008 | Noda et al. | 438/114 |
| 7,485,494 B2 * | 2/2009 | Kang et al. | 438/113 |
| 7,534,498 B2 * | 5/2009 | Noda et al. | 428/446 |
| 7,875,500 B2 * | 1/2011 | Inada et al. | 438/113 |
| 7,875,501 B2 * | 1/2011 | Tanaka et al. | 438/113 |
| 7,910,206 B2 * | 3/2011 | Kiuchi et al. | 428/354 |
| 7,960,023 B2 * | 6/2011 | Sim et al. | 428/354 |
| 7,988,807 B2 * | 8/2011 | Noda et al. | 156/272.2 |
| 8,038,839 B2 * | 10/2011 | Noda et al. | 156/712 |
| 8,114,759 B2 * | 2/2012 | Saito et al. | 438/465 |
| 8,211,540 B2 * | 7/2012 | Hong et al. | 428/354 |
| 2004/0020338 A1 * | 2/2004 | Ookawa | 83/13 |
| 2004/0188861 A1 * | 9/2004 | Kurimoto et al. | 257/786 |
| 2004/0213994 A1 * | 10/2004 | Kozakai et al. | 428/354 |
| 2006/0093811 A1 * | 5/2006 | Ookawa | 428/343 |
| 2006/0128065 A1 * | 6/2006 | Inada et al. | 438/118 |
| 2007/0077685 A1 * | 4/2007 | Noda et al. | 438/107 |
| 2007/0126129 A1 * | 6/2007 | Ahn et al. | 257/783 |
| 2008/0102284 A1 * | 5/2008 | Hong et al. | 428/413 |
| 2008/0171187 A1 * | 7/2008 | Inada et al. | 428/220 |
| 2010/0099240 A1 * | 4/2010 | Watanabe et al. | 438/464 |
| 2010/0279491 A1 * | 11/2010 | Kiuchi et al. | 438/464 |
| 2010/0330780 A1 * | 12/2010 | Hwang et al. | 438/464 |
| 2011/0073847 A1 * | 3/2011 | Kobayashi et al. | 257/40 |
| 2011/0156277 A1 * | 6/2011 | Takamoto et al. | 257/778 |
| 2011/0156278 A1 * | 6/2011 | Takamoto et al. | 257/778 |
| 2011/0156279 A1 * | 6/2011 | Takamoto et al. | 257/778 |
| 2011/0156280 A1 * | 6/2011 | Takamoto et al. | 257/778 |
| 2011/0256394 A1 * | 10/2011 | Nishio | 428/354 |
| 2012/0141786 A1 * | 6/2012 | Uh et al. | 428/343 |
| 2012/0205030 A1 * | 8/2012 | Kiuchi et al. | 156/85 |

FOREIGN PATENT DOCUMENTS

| | | | |
|---|---|---|---|
| JP | 2011-9763 | * | 1/2011 |
| KR | 10-0669134 B1 | | 1/2007 |
| KR | 10-2008-0020396 A | | 3/2008 |
| WO | WO 2009/123608 | * | 10/2009 |

* cited by examiner

MULTI-FUNCTION TAPE FOR A SEMICONDUCTOR PACKAGE AND METHOD OF MANUFACTURING A SEMICONDUCTOR DEVICE USING THE SAME

CROSS-REFERENCE TO RELATED APPLICATION

This application is a continuation of pending International Application No. PCT/KR2009/001264, entitled "Multi-Functional Tape for Semiconductor Package and a Method for Manufacturing Semiconductor Device Using the Same," which was filed on Mar. 13, 2009, the entire contents of which are hereby incorporated by reference and for all purposes.

BACKGROUND

1. Field

Embodiments relate to a multifunction tape for a semiconductor package and a method of manufacturing a semiconductor device using the same.

2. Background of the Related Art

High capacity in semiconductor devices may be accomplished by a high integration technique for increasing a number of cells per unit area in view of quality and by a packaging technique through lamination of plural chips in view of quantity.

As a packaging technique, a multi-chip packaging (MCP) method may be used. In the MCP method, plural chips may be laminated on top of each other by applying a bonding agent and may be electrically connected to each other via wire bonding. As a result, an overall package size may become greater than a space of the laminated chips due to a space needed for wire bonding, thereby providing an unnecessary space.

Alternatively, a wafer level stack packaging (WSP) method may be used. In the WSP method, silicon through-electrodes may be formed in a wafer having a circuit thereon and may be filled with a conductive material to provide direct electrical connection between layers.

SUMMARY

Embodiments are directed to a multifunction tape for a semiconductor package and a method of manufacturing a semiconductor device using the same.

At least one of the above and other features and advantages may be realized by providing a multifunction tape for a semiconductor package and configured to bond to a device-formed side of a semiconductor substrate having a plurality of devices thereon while performing a process of grinding a side of the semiconductor substrate opposite to the device-formed side and a process of dicing the semiconductor substrate into individual chips with a dicing tape having a UV-curable adhesive layer bonded to the ground side of the semiconductor substrate, the multifunction tape being bonded to the individual chips while the individual chips, separated from each other by the dicing process, are picked up and die-attached, the multifunction tape including a base film; a UV-curable adhesive layer on one side of the base film; and first and second bonding layers on the adhesive layer.

The first bonding layer may be interposed between the adhesive layer and the second bonding layer, the first bonding layer including a UV-curable material configured to improve peeling characteristics with respect to the adhesive layer and the second bonding layer after UV irradiation.

The first bonding layer may have a 180 degree average peeling force of about 0.1 N/25 mm or less with respect to the adhesive layer after UV irradiation.

The first and second bonding layers may be thermosetting layers.

The second bonding layer may have a storage modulus of about 0.1 to about 10 MPa at 60° C.

At least one of the above and other features and advantages may also be realized by providing a multifunction tape for a semiconductor package and configured to bond to a device-formed side of a semiconductor substrate having a plurality of devices thereon while performing a process of grinding a side of the semiconductor substrate opposite to the device-formed side and a process of dicing the semiconductor substrate into individual chips, the multifunction tape being bonded to the individual chips while the individual chips, separated from each other by the dicing process, are picked up and die-attached, the multifunction tape including a base film; a UV-curable adhesive layer on one side of the base film; and first and second bonding layers on the adhesive layer.

The first bonding layer may be interposed between the adhesive layer and the second bonding layer, the first bonding layer including a UV-curable material configured to improve peeling characteristics with respect to the adhesive layer and the second bonding layer after UV irradiation.

The first bonding layer may have a 180 degree average peeling force of about 0.1 N/25 mm or less with respect to the adhesive layer after UV irradiation.

The first and second bonding layers may be thermosetting layers.

The second bonding layer may have a storage modulus of about 0.1 to about 10 MPa at 60° C.

At least one of the above and other features and advantages may also be realized by providing a method of fabricating a semiconductor device, the method including bonding a multifunction tape to a device-formed side of a semiconductor substrate, the multifunction tape including a base film, a UV-curable adhesive layer on one side of the base film, and first and second bonding layers on the adhesive layer; grinding a side of the semiconductor substrate opposite to the device-formed side; bonding a dicing tape to the ground side of the semiconductor substrate; dicing the semiconductor substrate into individual chips; picking up the individual chips with the first and second bonding layers bonded thereto; and die-attaching the individual chips using the first and second bonding layers.

The method may further include irradiating UV rays to the multifunction tape after dicing the semiconductor substrate and prior to picking up the chips.

The method may further include increasing a separation between respective individual chips by expanding the dicing tape prior to picking up the individual chips.

At least one of the above and other features and advantages may also be realized by providing a method of fabricating a semiconductor device, the method including bonding a multifunction tape to a device-formed side of a semiconductor substrate, the multifunction tape including a base film, a UV-curable adhesive layer on one side of the base film, and first and second bonding layers on the adhesive layer; grinding a side of the semiconductor substrate opposite to the device-formed side; dicing the semiconductor substrate into individual chips; picking up the individual chips with the first and second bonding layers bonded thereto; and die-attaching the individual chips using the first and second bonding layers.

The method may further include irradiating UV rays to the multifunction tape after dicing the semiconductor substrate and prior to picking up the individual chips.

The method may further include increasing a separation between respective individual chips by expanding the multifunction tape prior to picking up the individual chips.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
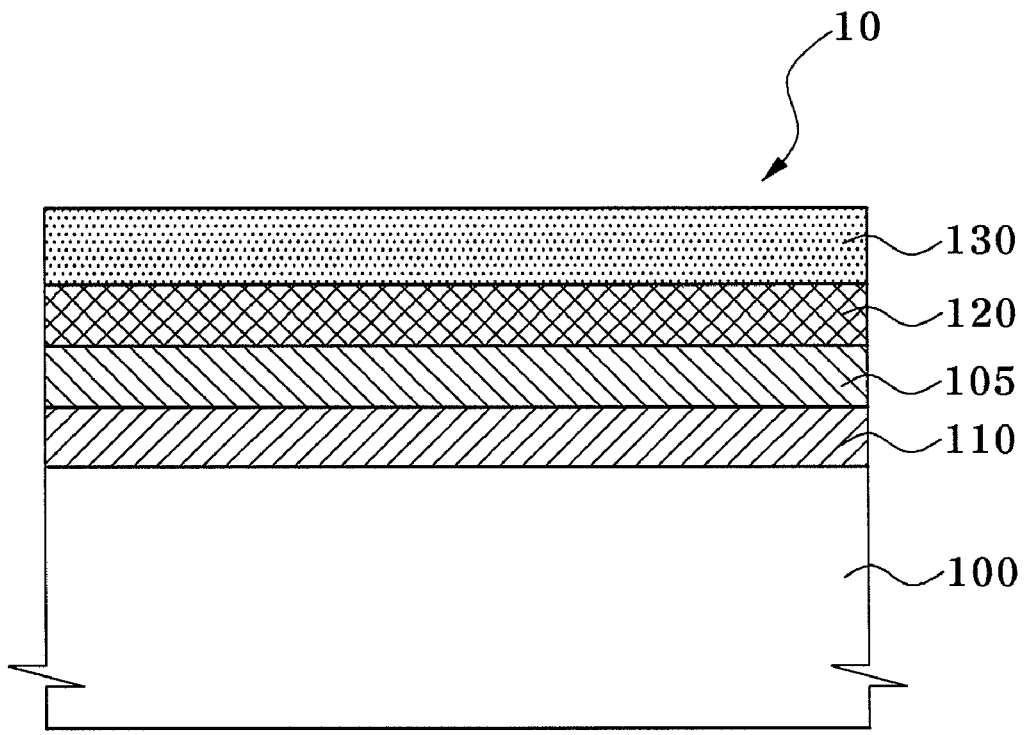
FIG. 1 illustrates a sectional view of a multifunction tape for a semiconductor package according to an embodiment.

Korean Patent Application No. 10-2008-0024027, filed on Mar. 14, 2008, in the Korean Intellectual Property Office, and entitled: "Multi-Functional Tape for Semiconductor Package and a Method for Manufacturing Semiconductor Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Referring to FIG. 1, which illustrates a sectional view of a multifunction tape for a semiconductor package according to an embodiment, the multifunction tape 10 may include a base film 100, an adhesive layer 110, a first bonding layer 105, a second bonding layer 120, and a protective film 130.

Herein, a bonding layer may be a layer that facilitates bonding to an object. The adhesive layer may be a layer that may be adhered to an object and may be removed therefrom after curing or the like. For example, a UV-curable adhesive may be an adhesive that will be applied to a semiconductor wafer or the like, and cured and peeled therefrom by UV irradiation.

Further, the bonding layer may be a layer to which a semiconductor wafer will be bonded, and which will be separated from the adhesive layer but bonded to individual chips, when dicing the semiconductor wafer into the chips and picking up the chips, so as to be used as a bonding agent when the chips are secured to a next-level substrate, e.g., a board or lead frame.

Further, the adhesive layer may be a layer that has a lower peeling force with respect to an adjacent layer than the bonding layer has with respect to an object and may be used for temporary joining.

The multifunction tape of the embodiments may be consistently used throughout a back grinding process, a dicing process, and a die-bonding process. Thus, it is very advantageous when the multifunction tape is used in a WSP method in which die-attachment is performed with the bonding agent applied to a circuit-formed side of a semiconductor wafer.

Base Film

First, the base film 100 of the multifunction tape 10 according to the present embodiment will be described.

The base film 100 may be substantially the same as that of a tape that is generally used for back grinding processes.

Various plastic films may be used as the base film of the tape for the back grinding process. For example, a thermoplastic expandable plastic film may be used as the base film.

When a wafer having a circuit design is exposed to physical impact during the back grinding process, cracks may be formed in the wafer or the wafer may be broken.

Thus, the base film may have thermoplastic and expandable properties to protect the wafer by, e.g., absorbing and relieving the impact during the back grinding process.

Further, the base film may facilitate ultraviolet transmission. for example, the adhesive layer 110 may be a UV-curable adhesive composition. Thus, the base film may exhibit good transmittance of ultraviolet rays in a wavelength at which the adhesive composite can be cured.

Preferably, the base film 100 does not contain a UV absorbent or the like.

The base film 100 may exhibit chemical stability. For example, the base film may contact CMP slurries during polishing and may be exposed to physical impact during back grinding. Thus, the base film may exhibit chemical stability.

Polymers, e.g., polyolefin polymer, generally exhibiting chemical stability, may be suitably used for the base film 100.

Polymer films for use in the base film may include, e.g., polyolefin-based films such as polyethylene, polypropylene, ethylene/propylene copolymers, polybutene-1, ethylene/vinyl acetate copolymers, mixtures of polyethylene/styrene butadiene rubber, polyvinyl chloride films, and the like.

The base film may include plastics, e.g., polyethylene terephthalate, polycarbonate, poly(methyl methacrylate) and the like; thermoplastic elastomers, e.g., polyurethane, polyamide-polyol copolymers, and the like; or mixtures thereof.

The base film 100 may have a multilayer structure to improve a bonding force with respect to the adhesive layer or to improve impact absorption during the back grinding process.

The base film may be prepared by, e.g., blending and melting polyolefin chips to produce a polyolefin melt, followed by extruding or blowing the polyolefin melt.

Thermal resistance and mechanical properties of the base film may be determined according to a kind of blended chips. The base film may be subjected to surface modification to improve the bonding force with respect to the adhesive layer 110.

The surface modification may include a physical or a chemical process. The physical process may include, e.g., a plasma process. The chemical process may include, e.g., an in-line coating process, a primer process, or the like. In an implementation, the surface modification of the base film may be performed by a corona-discharge process so as to allow the adhesive layer 110 to be coated thereon.

The base film 100 may have a thickness of about 30 μm to about 300 μm in terms of workability and UV transmission.

Maintaining the thickness of the base film 100 at about 30 μm or greater may help prevent deformation of the base film by heat during UV irradiation and may help ensure sufficient ability to absorb impact during the back grinding process. Maintaining the thickness of the base film 100 at about 300 μm or less may help ensure that a single roll of a finished product does not have a smaller length than the thickness thereof in practice, thereby ensuring a short time for roll replacement.

In an implementation, the base film 100 may have a thickness of about 50 μm to about 200 μm in order to fill up a wafer surface on which bumps are formed, the bumps providing severe roughness.

Adhesive Layer

Next, the adhesive layer 110, e.g., a UV-curable adhesive layer, of the multifunction tape 10 according to the present embodiment will be described.

Although the adhesive layer 110 is not limited to a particular material, properties before and after UV irradiation may be considered in selection of the material for the adhesive layer 110. Prior to UV irradiation, the adhesive layer 110 may exhibit strong tack to prevent the wafer from being damaged due to vibration or movement and to prevent chemical materials, e.g., CMP slurries, from penetrating interfaces between respective layers during the back grinding process by strongly holding the first and second insulation bonding layers 105 and 120 and the wafer on the adhesive layer 110. In addition, after UV irradiation, the adhesive layer 110 may exhibit an increased cohesive force and may contract by a crosslinking reaction to facilitate peeling of the adhesive layer 110 and the base film 100 from the wafer, to which the first and second insulation bonding layers 105, 120 are bonded, by a reel-shaped bonding tape through a significant reduction in bonding force of the adhesive layer 110 to the first insulation bonding layer 105. In other words, a suitable material that is capable of the aforementioned properties before and after the UV irradiation may be used for the adhesive layer 110.

The adhesive layer 110 in a tape for use in the back grinding process may include a UV-curable composition or a non-UV curable composition.

The non-UV curable composition may provide a comparatively low bonding force without UV irradiation, so that the adhesive layer may be easily peeled from the wafer by a reel-shaped bonding tape without UV irradiation.

In the WSP method, the adhesive layer 110 may be peeled from the first insulation bonding layer 105, which may be an organic interface. In this case, the adhesive layer including the non-UV curable composition may not be substantially peeled off by the reel-shaped bonding tape. Thus, the UV-curable composition may be used for an adhesive layer of a tape for use in the WSP method.

There may be two types of UV-curable composition. One may include a mixture composition of UV-curable acrylate and an acrylic adhesive binder acting to form and support a coating layer. Another composition may have a structure wherein UV-curable acrylate may be provided to a side chain of an acrylic adhesive binder.

When the mixture composition is applied to a tape for use in the back grinding process, there may be no transport of the UV-curable acrylate, which may be mainly composed of low molecular weight materials, since a target member of the tape may be an inorganic material such as wafers. As a result, bonding force between the adhesive layer 110 and the wafer may be significantly reduced after UV irradiation to allow the adhesive layer to be peeled off by the reel-shaped bonding tape. However, in a tape for use in the WSP method, the adhesive layer 110 may contact an organic interface such as the first insulation bonding layer 105. Thus, the mixture composition of the adhesive layer may facilitate undesirable partial transport of low molecular weight acrylate into the first insulation bonding layer 105, and transport of the acrylate may be cured by UV rays, thereby causing an increase in bonding force between the layers after UV irradiation. Thus, according to the present embodiment, the adhesive layer 110 may have a structure wherein a UV-curable carbon-to-carbon double bond is provided to a side chain of the acrylic adhesive binder, rather than as an admixture to the composition.

The structure wherein a low molecular weight material having a carbon-to-carbon double bond is provided to a side chain of an adhesive resin exhibiting adhesive properties through a chemical reaction so as to behave like a single molecule may be referred to herein as an intrinsic adhesion composition.

The intrinsic adhesion composition may be prepared by, e.g., polymerizing an adhesive resin and providing a carbon-to-carbon double bond to the polymerized adhesive resin.

A reaction mechanism for providing a low molecular weight acrylate having a carbon-to-carbon double bond in the inherent adhesion binder may be as follows.

The reaction mechanism may proceed by combinations of functional groups, e.g., a combination of a carboxyl group and an epoxy group, a combination of a hydroxyl group and an isocyanate group, a combination of a carboxyl group and an amine group, and the like, which may facilitate polymerization to an acrylic side chain.

Additionally, any suitable combination of functional groups may be used that enables the reaction mechanism to provide a low molecular weight acrylate having the carbon-to-carbon double bond to a side chain of an adhesive polymer. Each of the functional groups may be selectively applied to the adhesive polymer binder or low molecular weight acrylate.

In an implementation, the intrinsic adhesive binder may have a molecular weight of about 100,000 to about 1,000,000 and may be prepared by providing a low molecular weight material having the carbon-to-carbon double bond and containing a terminal isocyanate group to a side chain of a binder copolymer through a urethane reaction.

The UV-curable adhesive composition may be prepared by mixing a thermosetting agent, a photo initiator, and the like, in addition to the prepared adhesive binder.

Any kind of suitable thermosetting agent may be used that may be cured through reaction with a functional group provided to the side chain of the adhesive binder.

If the functional group provided to the side chain is a carboxyl group, an epoxy curing agent may be used as the thermosetting agent. If the functional group provided to the side chain is a hydroxyl group, an isocyanate curing agent may be used.

Additionally, a melamine curing agent may be used as the thermosetting agent. Further, a mixture of at least two of the epoxy curing agent, the isocyanate curing agent, and the melamine curing agent may be used.

The thermosetting agent may be added to the adhesive layer to provide a bonding force with respect to the polyolefin base film.

Any kind of suitable photo initiator including ketone and acetonephenone-based photo initiators may be used that allows molecular chains to be broken by UV rays to produce radicals.

When the photo initiator is included in the adhesive layer, the carbon-to-carbon double bond of the side chain in the adhesive binder may be subjected to a crosslinking reaction by the radicals to raise a glass transition temperature of the adhesive layer, so that the adhesive layer loses tack properties. As a result, the adhesive layer 110 may be peeled from the first insulation-bonding layer 105 with minimal force.

The adhesive layer 110 may be formed on the base film 100 by, e.g., direct coating or may be transferred to the base film 100 after coating the adhesive layer 110 to a release film and drying the adhesive layer.

When the adhesive layer 110 is directly coated on the polyolefin base film 100, the adhesive layer may dried at 60° C. or greater, which may cause the polyolefin base film to significantly contract while passing through a drier, thereby providing dimensional instability. Therefore, it is possible that the adhesive layer may be formed on the base film by transfer coating.

Irrespective of the former or the latter, any suitable coating process including bar coating, gravure coating, comma coating, reverse-roll coating, applicator coating, spray coating, and the like may be used to form the adhesive layer 110 that can form the adhesive coat on the base film 100.

First Bonding Layer

In the multifunction tape according to the present embodiment, the adhesive layer 110 may be coated on the base film 100 and the first (e.g., insulation) bonding layer 105 may be laminated on the adhesive layer 110.

The first insulation bonding layer 105 may be designed to allow a part thereof to be cured by ultraviolet rays so as to allow not only the adhesive layer 110 but also the first insulation bonding layer 105 contacting the adhesive layer 110 to be cured by UV irradiation, thereby significantly enhancing peeling characteristics of the multifunction tape and facilitating peeling. For example, the peeling characteristics of the first insulation bonding layer 105 may be improved relative to a bonding layer that does not include a UV-curable material.

The first insulation bonding layer 105 may act as a bonding agent for finally bonding upper and lower chips. Thus, it may exhibit properties capable of satisfying reliability of a semiconductor packaging level. Further, the first insulation bonding layer 105 may have enhanced workability for packaging, e.g., enhanced peeling characteristics for removing the base film 100 and the adhesive layer 110 from the first and second insulation bonding layers 105, 120 without damage to the bonding layers after back grinding.

Like the second insulation bonding layer 120 to be described in further detail below, the first insulation bonding layer 105 may also bonded at about 60° C. to the wafer surface, which may have a circuit design and severe roughness thereon, and may be die-attached at about 200° C. to a support substrate, e.g., a lead frame or PCB, after dicing.

A suitable composition that maintains a bonding force between the upper and lower chips while satisfying reliability of a semiconductor packaging level may be used for the first insulation bonding layer 105.

For example, the first insulation bonding layer 105 may also be bonded at one side to the wafer or the like with the other side thereof contacting the second insulation bonding layer 120 when the chips are stacked in multiple layers in the WSP method, irrespective of a need for improvement in peeling characteristics in terms of process.

In an implementation, the first insulation bonding layer 105 may include a mixture of an acrylic resin having film formability and a high molecular weight as well as an epoxy resin acting as a curing part.

Both the first insulation bonding layer 105 and the second insulation bonding layer 120 may be provided as film-type bonding agents. Thus, a thermoplastic resin having good film formability and a curing part providing a bonding force may be used in the first and second insulation bonding layers 105 and 120.

In an implementation, acrylic resin may be used as the thermoplastic resin. An example of the acrylic resin may include an acrylic rubber that is a copolymer of acrylic ester or methacrylic ester and acrylonitrile.

A suitable epoxy resin that provides a desired bonding force in a cured state may be used in the first insulation bonding layer 105. Here, it may be important to have two or more functional groups to perform a curing reaction. Thus, the epoxy resin may include at least one of a bisphenol A-type epoxy resin, a phenol novolac epoxy resin, and a cresol novolac epoxy resin.

Further, the first insulation bonding layer 105 may contain a curing accelerator for curing the epoxy resin. The curing accelerator may be include, e.g., imidazole curing accelerators, amine curing accelerators, phenol curing accelerators, and the like.

It may be important for the acrylic resin, the epoxy resin, and the curing accelerator to exhibit low moisture absorption during curing. The first insulation bonding layer 105 may further include inorganic particles, e.g., silica, to improve dimensional stability and thermal resistance.

In an implementation, the first insulation bonding layer 105 may further include a silane coupling agent.

In addition to the compositions providing the reliability of the semiconductor packaging level and bonding capability, the first insulation bonding layer 105 may also include a UV-curable polymer that has a carbon-to-carbon double bond.

For example, even when the adhesive layer 110 on the first insulation bonding layer 105 has reduced tack after UV curing, it may not be easily peeled from the wafer or the like by the reel-shaped bonding film. Thus, the first insulation bonding layer 105 may be cured by UV irradiation to improve peeling characteristics.

In an implementation, a compound added to the first insulation bonding layer 105 and having the carbon-to-carbon double bond may be a polymeric material.

Even in the case of UV curing, low molecular weight compounds such as oligomers or monomers may undergo partial transport into the adhesive layer 110, which contacts the low molecular weight compounds, and may be cured at an interface between the adhesive layer and the low molecular weight compounds by UV irradiation during transition, thereby significantly deteriorating peeling characteristics after UV irradiation. Thus, in an implementation, a polymeric compound with the carbon-to-carbon double bond provided to a polymer chain may be used as the UV-curable compound which is added to the first insulation bonding layer 105.

In an implementation, the UV-curable polymer compound may be an adhesive binder that has a molecular weight of about 100,000 to about 1,000,000 and may be prepared by providing a low molecular weight material having a carbon-to-carbon double bond and containing a terminal isocyanate group to a side chain of a binder copolymer through a urethane reaction.

The first insulation bonding layer 105 may include about 0.1 to about 10 parts by weight of the UV-curable polymer compound, based on 100 parts by weight of the main components of the bonding layer, i.e., the acrylic resin, the epoxy resin, and the curing accelerator.

Maintaining the amount of the UV-curable polymer compound at about 0.1 parts by weight or greater may help ensure that the first insulation bonding layer 105 performs the UV curing reaction. As a result, the tack may be significantly reduced and peeling characteristics between the adhesive layer 110 and the first insulation bonding layer 105 may be improved. Maintaining the amount of the UV-curable polymer compound at about 10 parts by weight or less may help ensure that the bonding force of the first insulation bonding layer 105 to the chips is not lowered.

The UV-curable compound may be added to the first insulation bonding layer 105. Thus, the photo initiator may be added for accomplishing a radical curing reaction upon UV irradiation.

The photo initiator may be added in an amount of about 0.1 to about 5 parts by weight, based on 100 parts by weight of the UV-curable compound.

After UV irradiation, a 180 degree average peeling force between the first insulation bonding layer 105 and the adhesive layer 110 may be about 0.01 N/25 mm or less.

As in the adhesive layer 110, the first insulation bonding layer 105 may be formed by any suitable coating process that is capable of forming a uniform coating layer.

The first insulation bonding layer 105 may have a thickness of about 1 to about 100 μm. In an implementation, the first insulation bonding layer 105 may have a thickness of about 2 to about 30 μm. Maintaining the thickness of the first insulation bonding layer 105 at about 2 μm or greater may help ensure a suitable bonding force between the upper and lower chips. Maintaining the thickness of the first insulation bonding layer 105 at about 30 μm or less may help ensure that a size of the semiconductor package is not excessively increased. In addition, maintaining the thickness of the first insulation bonding layer 105 at about 30 μm or less may help ensure thickness uniformity when bonding chips to each other or a chip to a substrate, and a fillet phenomenon, as in the case of using a liquid bonding agent, that deteriorates reliability in semiconductor packaging, may be avoided.

Second Bonding Layer

Next, the second (e.g., insulation) bonding layer 120 of the multifunction tape 10 will be described.

The second insulation bonding layer 120 may be a bonding layer that directly contacts the wafer surface. In the WSP, the second insulation bonding layer 120 may not create a void on the wafer surface having bumps and severe roughness thereon during lamination, and may facilitate strong bonding between the upper and lower chips through die attachment.

The second insulation bonding layer 120 may finally bond the upper and lower chips to each other. Thus, it may exhibit properties capable of satisfying reliability of a semiconductor packaging level. Further, the second insulation bonding layer 120 may have enhanced workability for packaging. For example, it may fill up the wafer surface having the roughness so as not to create a void on the wafer surface during a mounting process, thereby preventing chipping or cracking during a dicing process as well as reliability deterioration by swelling even after die attachment.

The second insulation bonding layer 120 may be bonded at about 60° C. to the wafer surface on which circuit bumps are formed.

The second insulation bonding layer 120 may have a storage modulus of about 0.1 to about 10 MPa at 60° C.

Maintaining the storage modulus of the second insulation bonding layer 120 at about 0.1 MPa at 60° C. or greater may help prevent the fillet phenomenon caused by excessively high fluidity. Maintaining the storage modulus of the second insulation bonding layer 120 at about 10 MPa at 60° C. or less may help ensure that it has suitable fluidity and viscosity to sufficiently fill up the wafer surface having the bumps at a mounting temperature of 60° C.

In the present embodiment, components of the second insulation bonding layer 120 are similar to those of the first insulation bonding layer 105.

Like the first insulation bonding layer 105, the second insulation bonding layer 120 may include a mixture of an acrylic resin having film formability and a high molecular weight and an epoxy resin acting as a curing agent.

Here, the second insulation bonding layer 120 may not contain the UV-curable polymer compound and the photo initiator, which may be added to the first insulation bonding layer 105. For example, the first insulation bonding layer 105 may be UV-curable and the second insulation bonding layer may not be UV-curable. In another implementation, the first insulation bonding layer 105 may cure to a degree that is relatively higher than a degree to which the second insulation bonding layer 120 is cured when irradiated with a predetermined about of UV light.

The second insulation bonding layer 120 may also be provided as a film-type bonding agent. Thus, a thermoplastic resin having good film formability and a curing part providing a bonding force may be used in the second insulation bonding layer 120.

As in the first insulation bonding layer 105, the second insulation layer 120 may contains the acrylic resin as the thermoplastic resin.

The acrylic resin may include, e.g., an acrylic rubber that is a copolymer of acrylic ester or methacrylic ester and acrylonitrile.

A suitable epoxy resin that provides the desired bonding force in a cured state may be used for the second insulation bonding layer 120. Here, two or more functional groups may be used to perform a curing reaction. Thus, the epoxy resin may include at least one of a bisphenol A-type epoxy resin, a phenol novolac epoxy resin, and a cresol novolac epoxy resin.

Further, the second insulation bonding layer 120 may contain a curing accelerator for curing the epoxy resin. The curing accelerator may include, e.g., imidazole accelerators, amine accelerators, phenol accelerators, and the like. As such, the second insulation bonding layer 120 may include or may consist essentially of the acrylic resin acting as the binder, the epoxy resin acting as the curing part, and the curing accelerator for curing the epoxy resin. In order to allow the second insulation bonding layer 120 to have a storage modulus of about 0.1 to about 10 MPa at 60° C. as described above, the acrylic resin used as the binder in the second insulation bonding layer may be included in an amount of about 30 to about 70 parts by weight with respect to 100 parts by weight of the other components of the second insulation bonding layer 120 and may have a glass transition temperature of about −20 to about 20° C.

Maintaining the glass transition temperature of the acrylic resin at about −20 to about 20° C. may help ensure that the second insulation bonding layer 120 is able to provide sufficient fluidity to fill up the rough wafer surface having the bump thereon at a mounting temperature of 60° C. Maintaining the amount of the acrylic resin at about 30 parts by weight or greater may help ensure ease of rolling the multifunction tape because the film-shaped bonding agent is not likely to be broken due to lack of an absolute amount and film formation capability of the acrylic binder. Maintaining the amount of the acrylic resin at about 70 parts by weight or less may help prevent excessively high fluidity of the bonding layer, thereby ensuring sufficient dimensional stability and preventing the fillet phenomenon when the chips are bonded to the bonding layer.

The second insulation bonding layer 120 may further include inorganic particles such as silica in order to improve dimensional stability and thermal resistance.

In an implementation, the second insulation bonding layer 120 contacting the wafer surface may include at least one silane coupling agent or a mixture of silane coupling agents to increase a bonding force with respect to the wafer. As in the adhesive layer 110 and the first insulation bonding layer 105, the second insulation bonding layer 120 may be formed by any suitable coating process capable of forming a uniform coating layer.

The second insulation bonding layer 120 may have a thickness of about 1 to about 100 μm and preferably, about 2 to about 30 μm. Maintaining the thickness of the second insulation bonding layer 120 at about 2 μm or greater may help ensure a suitable bonding force to the bonding layer between the chips. Maintaining the thickness of the second insulation bonding layer 120 at about 100 μm or less may help ensure that a size of a semiconductor package is not increased in order to follow a trend for compactness and light weight of the semiconductor package.

Protective Film

Next, the protective film 130 of the multifunction tape according to the present embodiment will be described.

According to the present embodiment, any suitable protective film may be used as the protective film 130 that is capable of protecting the second insulation bonding layer 120 formed as the outermost part of the film from foreign matter or impact.

A running film for coating the second insulation bonding layer may be used as the protective film 130.

The protective film may be removed from the multifunction tape during the semiconductor packaging process. Thus, a polyethylene terephthalate film may be used for ensuring easy separation of the protective film therefrom.

The protective film 130 may be subjected to surface modification with polydimethylsiloxane or fluoride releasing agents to enhance release properties.

Next, a method of fabricating a semiconductor device using the multifunction tape as described above according to embodiments will be described with reference to the accompanying drawings.

FIGS. 2 to 9 illustrate sectional views of stages in a method of manufacturing a semiconductor device according to an embodiment.

In the following description, like elements will be denoted by like reference numerals throughout the drawings and a repeated description thereof will be omitted.

Figure 2:
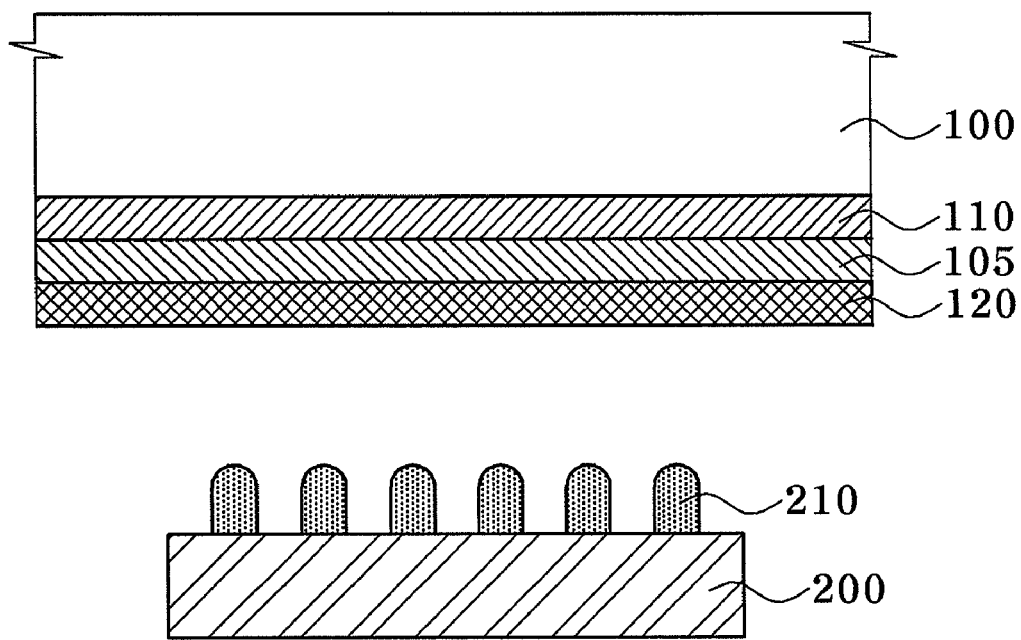
FIGS. 2 to 9 illustrate sectional views of stages in a method of manufacturing a semiconductor device according to an embodiment.
Figure 3:
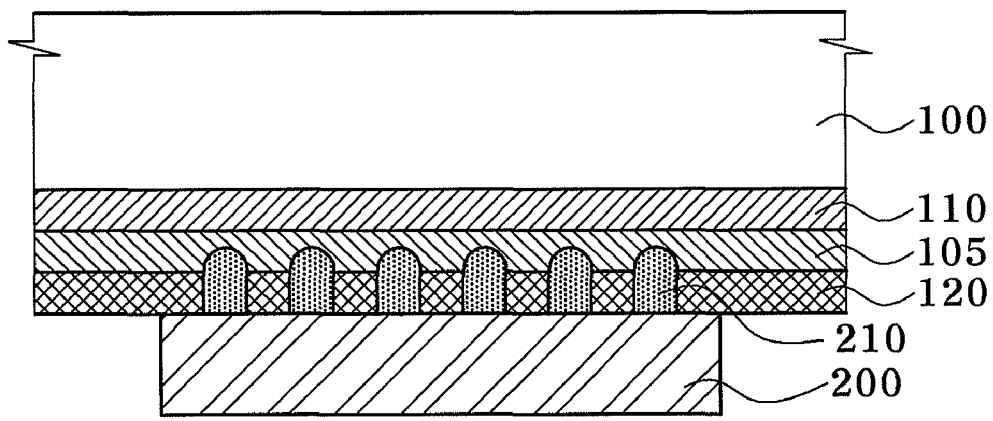

A multifunction tape according to an embodiment as shown in FIG. 2 may include a base film 100, an adhesive layer 110, a first bonding layer 105, a second bonding layer 120, and a protective film 130 (see FIG. 1), which protective film 130 will be removed during the packaging process.

A semiconductor wafer 200 may include a plurality of semiconductor devices on which bumps (e.g., metal protrusions, bond pads, solder balls, etc.) 210 may be formed.

The multifunction tape may be attached to a circuit-formed side of the wafer 200. For example, the multifunction tape may be attached to the circuit-formed side such that the bumps 210 are buried in the first and second bonding layers 105 and 120 (see FIG. 3).

Here, in order to increase bonding force and to prevent generation of voids, the multifunction tape may be heated to a predetermined temperature.

Figure 4:
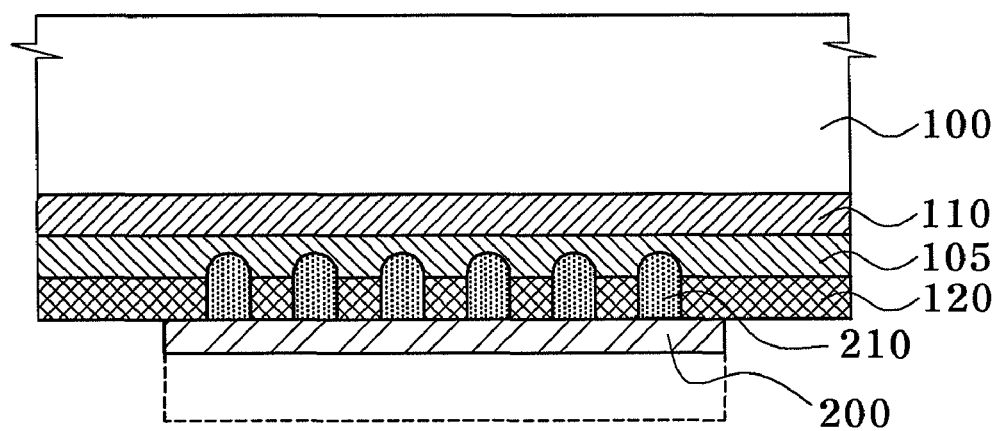

Then, a back side of the wafer 200 may be ground to a depth indicated by a dotted line (see FIG. 4).

Figure 5:
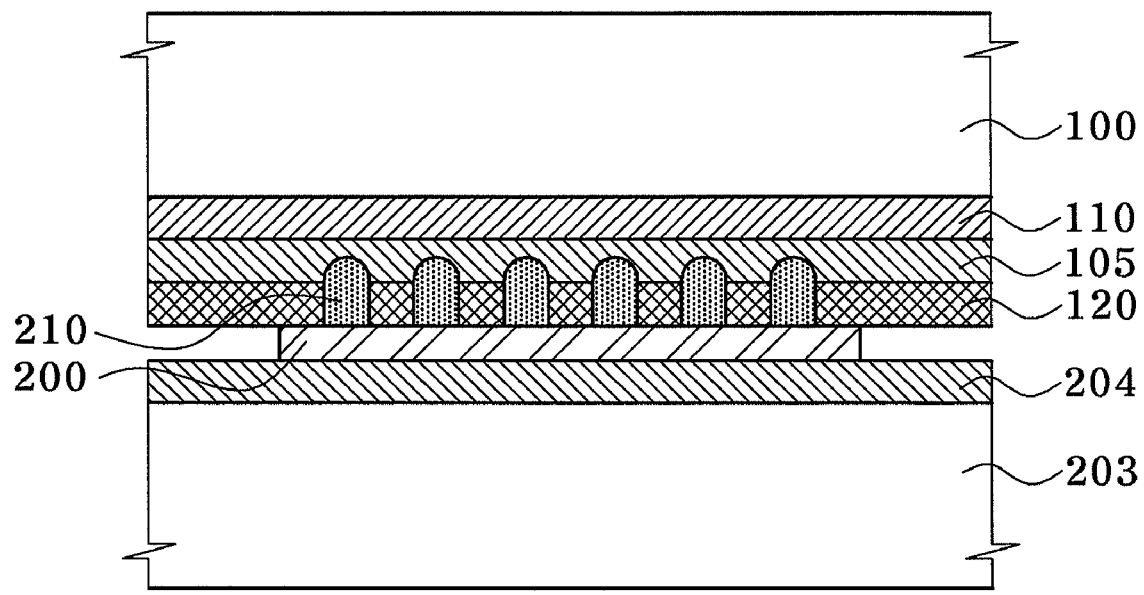
Figure 6:
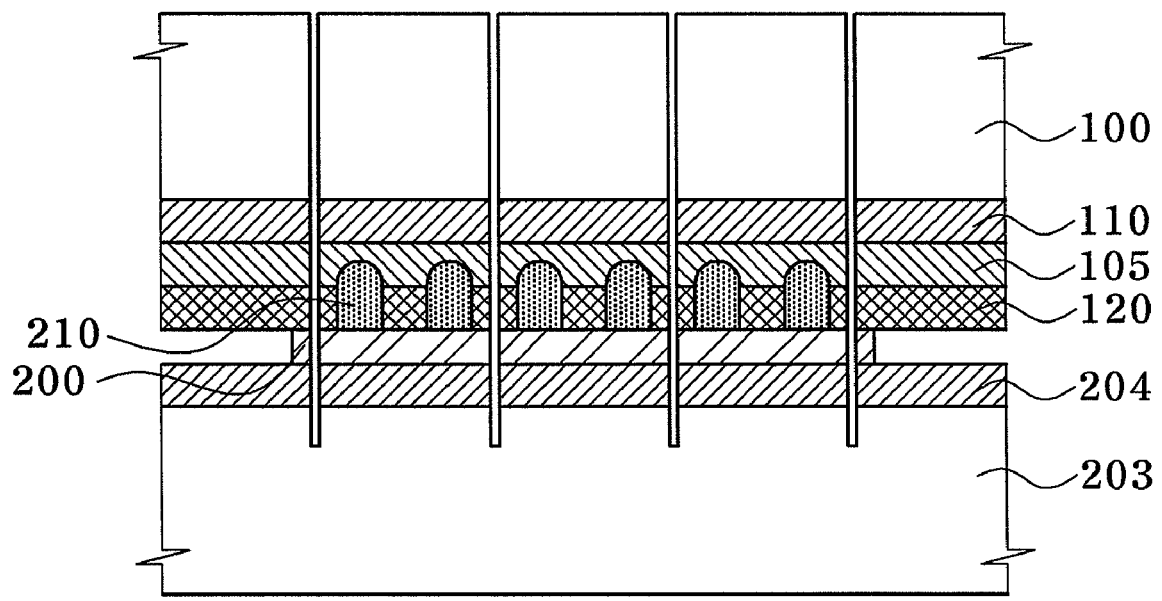
Figure 7:
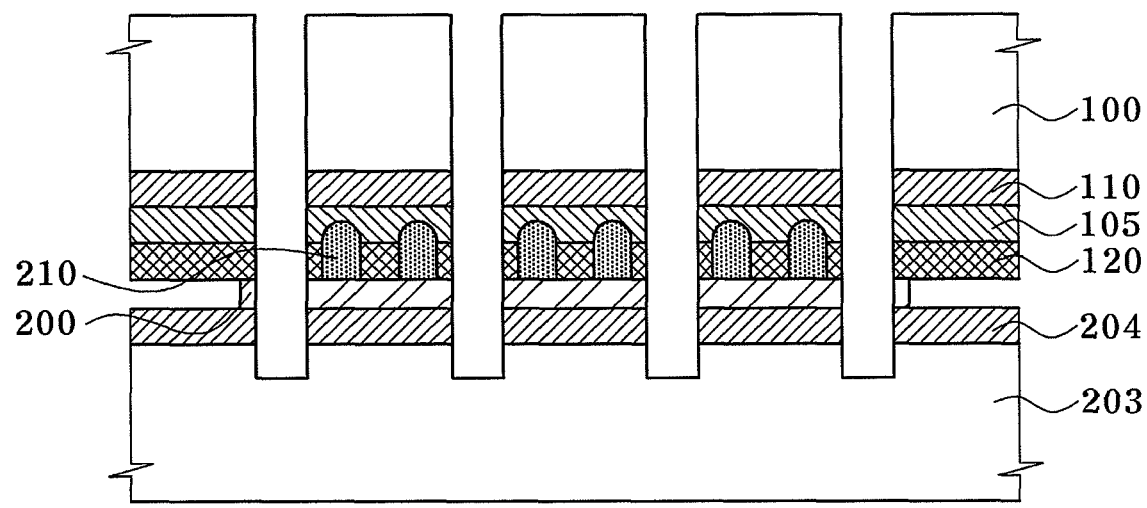

Then, an adhesive tape 203 for dicing may be bonded to the ground side of the wafer 200 (see FIG. 5). Next, the semiconductor devices on the wafer may be divided into individual chips by dicing (see FIG. 6). Here, the adhesive tape 203 for dicing may include a second UV-curable adhesive layer 204.

Dicing may be performed by, e.g., blade dicing or laser dicing. Heat may be generated during the blade dicing or the laser dicing. Thus, a large amount of water may be jetted to remove the heat. The first and second bonding layers 105, 120 may not be unstuck from the wafer even when heat is generated during the dicing. Further, the first and second bonding layers 105, 120 may have a low moisture absorption rate. Thus, they may not be substantially influenced by the water.

Next, ultraviolet rays may be irradiated to cure the adhesive layers 110 and 204. An expanding process may then be performed to expand a separation distance between the diced chips such that the chips may be easily picked up (see FIG. 7).

Figure 8:
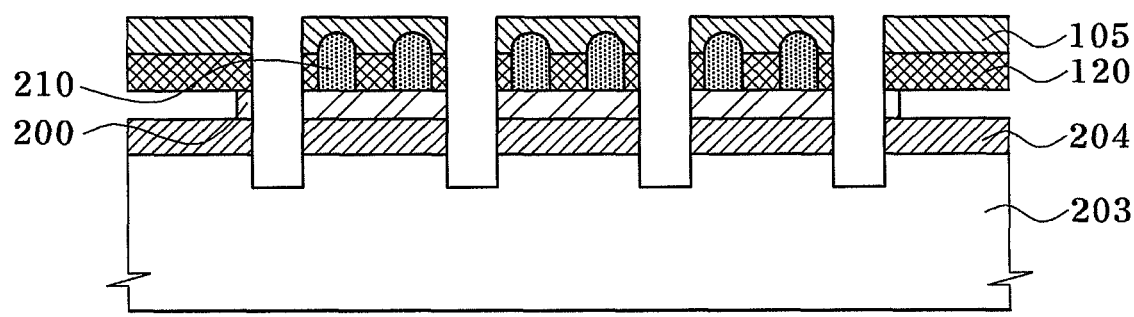
Figure 9:
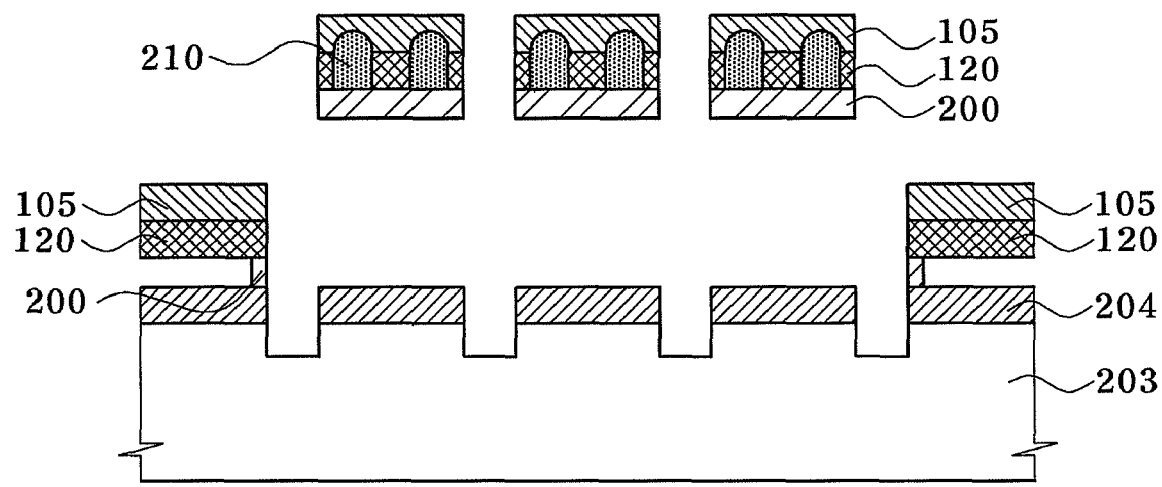

Finally, the dicing tape 203, the base film 100 and the adhesive layer 110 may be sequentially removed from the multifunction tape, and the chips having the first and second bonding layers 105 and 120 may be picked up (see FIGS. 8 and 9).

Here, the first and second bonding layers 105 and 120 may be used as bonding agents during subsequent die-bonding and/or attachment processes in a semiconductor package to fabricate semiconductor devices.

FIGS. 10 to 15 illustrate sectional views of stages in a method of fabricating a semiconductor device according to another embodiment.

Figure 10:
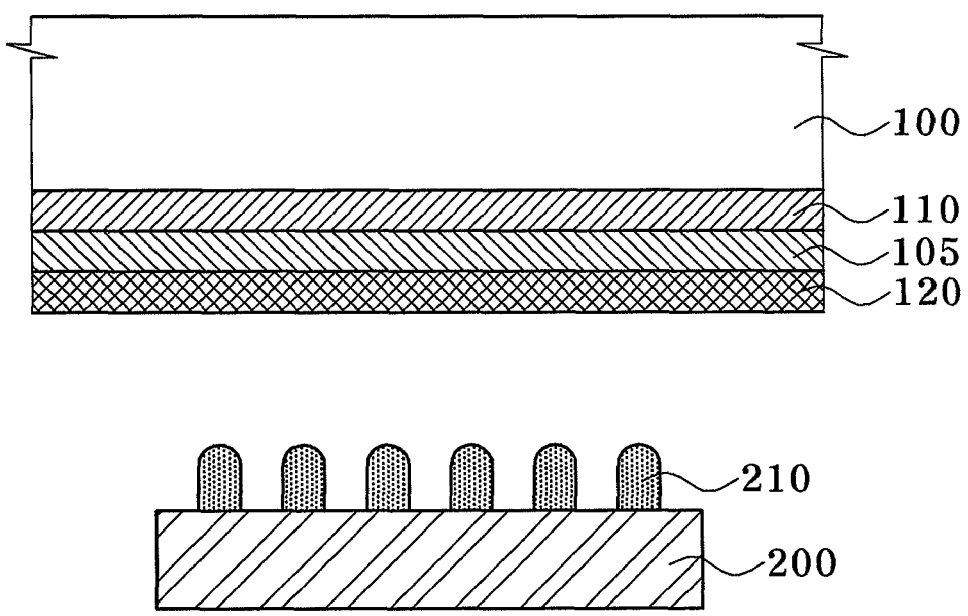
FIGS. 10 to 15 illustrate sectional views of stages in a method of fabricating a semiconductor device according to another embodiment.
Figure 11:
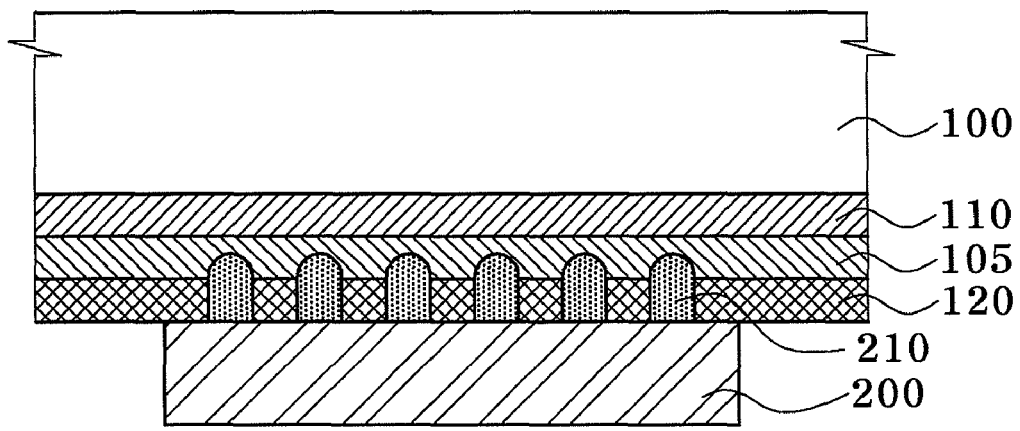

Referring to FIG. 10, first, a multifunction tape having the same configuration as that of the previous embodiment and a semiconductor wafer 200 having bumps 210 may be prepared.

Figure 12:
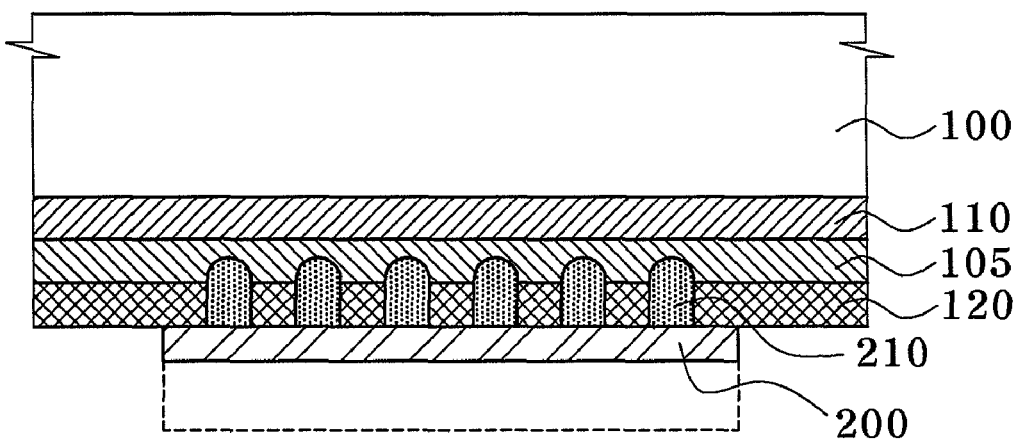

Then, the multifunction tape may be attached to a circuit-formed side of the wafer 200 (see FIG. 11) and a back side of the wafer 200 may be ground to a depth indicated by a dotted line (see FIG. 12).

Figure 13:
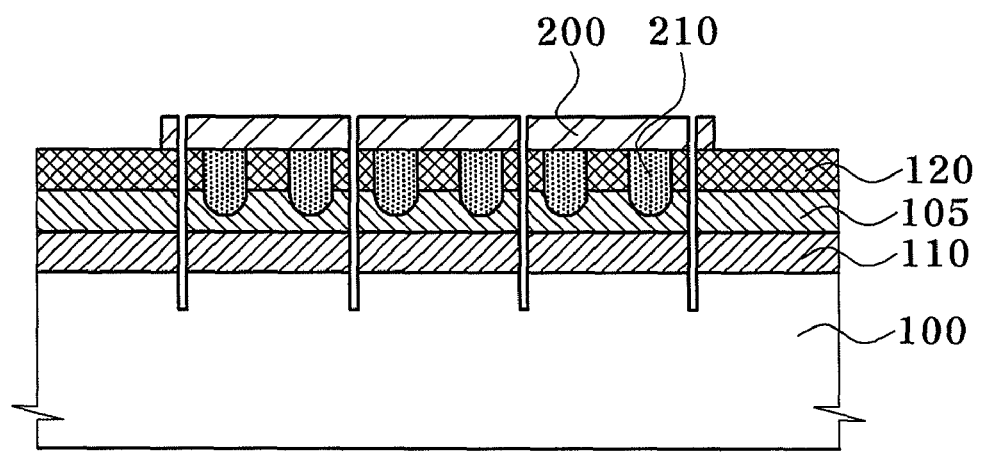
Figure 14:
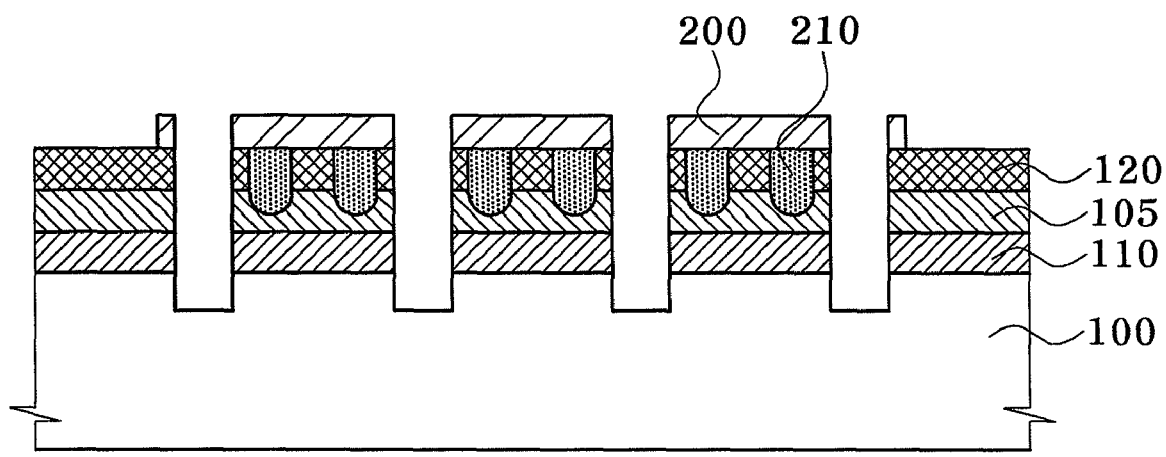

Next, dicing may be performed using the multifunction tape, without a separate dicing tape, to divide a plurality of semiconductor devices on the wafer 200 into individual chips (see FIG. 13).

Then, ultraviolet rays may be irradiated to cure the adhesive layer 110. An expanding process may be performed to expand a separation distance between the diced chips such that the chips can be easily picked up (see FIG. 14).

Figure 15:
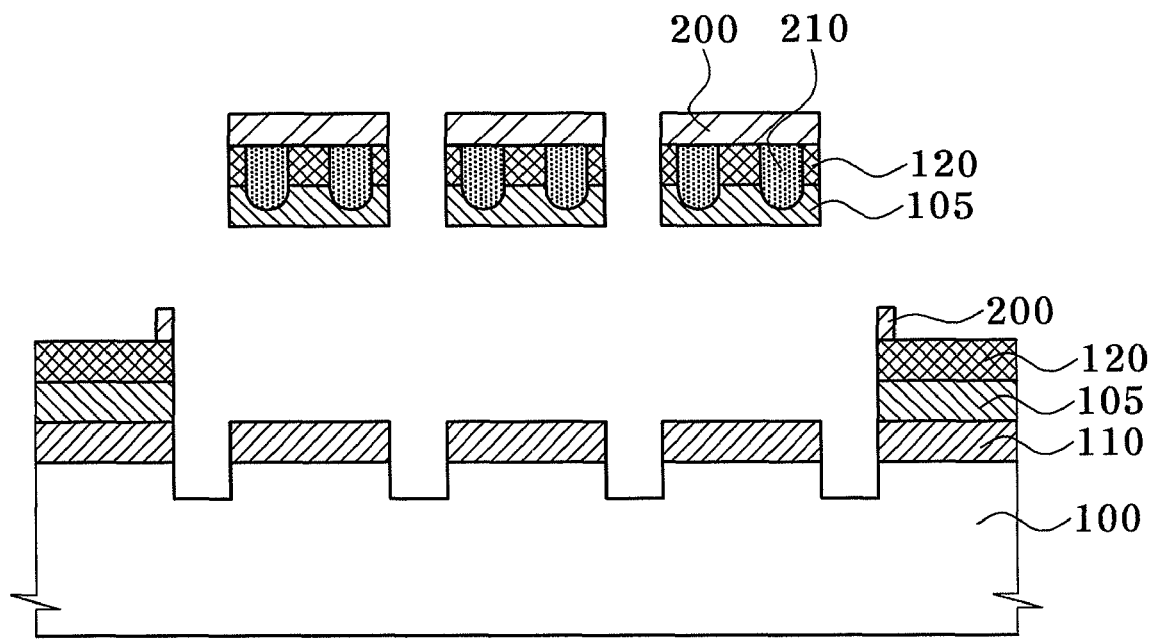

Finally, the chips with the first and second bonding layers 105 and 120 attached thereto may be picked up from the multifunction tape (see FIG. 15).

Here, the first and second bonding layers 105 and 120 may be used as bonding agents during subsequent die-bonding or attachment processes in the semiconductor packaging process to fabricate semiconductor devices.

In the embodiment illustrated in FIGS. 10 to 15, the back grinding process, the dicing process, and the die-attachment process may be consistently performed using a single multifunction tape.

Next, the embodiments will be described in detail with reference to examples, which are given not for restriction of the embodiments but by way of illustration only.

Example 1

Preparation of an Adhesive Layer A-1

A reflux condenser, a thermometer, and a dropping funnel were equipped to a 2 L 4-neck flask in which 220 g of ethyl acetate and 150 g of toluene were charged.

After raising the temperature of the solution in the flask to 60° C., a mixture of methylmethacrylate 118 g, butylacrylate monomer 75 g, 2-ethylhexyl acetate 187 g, 2-hydroxyethylmethacrylate 120 g, acrylic acid 30 g, and benzoyl peroxide 2.0 g was added to the flask dropwise through the dropping funnel at 90° C. for 3 hours.

While adding the mixture, the solution was stirred at 250 rpm; and the reactant was then reacted for 3 hours at the same temperature. Then, 1.0 g of diazoisobutyronitrile was further added to the reactant in the flask, which in turn was maintained for 5 hours, thereby finishing polymerization.

Next, 15 g of isocyanoethylmethacrylate was added to the prepared polymer binder resin and reacted therewith at room temperature for 24 hours, thereby preparing an inherent adhesive binder CA-100.

The inherent adhesive binder CA-100 had a viscosity of 8000 cps and contained 40% solid particles.

Next, a UV-curable adhesive composition was prepared by adding 8 g of poly-isocyanate curing agent AK-75 (Aekyung Chemical Co., Ltd.) and 1 g of IC-184 (Ciba-Geigy Ltd.) to 100 g of the inherent adhesive binder CA-100 which contained 40% of solid particles and had a weight average molecular weight of 400,000.

The UV-curable adhesive composition was coated to 10 μm on one side of a 38 μm PET release film SRD-T38 (Saehan Media Co., Ltd.) using an applicator and dried at 80° C. for 2 minutes. Then, after lamination on a 100 μm PO film (OD-100, Riken Technos, Co., Ltd.) at 60° C., the UV-curable adhesive composition was subjected to aging at 40° C. for three days in an oven, thereby preparing an adhesive layer A-1.

Preparation of a First Insulation Bonding Layer B-1

After preparing a mixture using 260 g of acrylic resin WS-023 (hydroxyl value or acid value of 20 mgKOH/g, Tg of −5° C., average molecular weight of 500,000, OH or COOH content of 20, Nagasechemtech Co., Ltd.), 120 g of cresol novolac epoxy resin YDCN-500-4P (molecular weight of 10,000 or less, Kukdo Chemical Co., Ltd.), 40 g of cresol novolac curing agent MEH-7800SS (Maywa Plastic Industries Co., Ltd.), 0.1 g of imidazole curing accelerator 2P4MZ (Shikoku Chemical Industries Co., Ltd.), 0.5 g of mercaptosilane coupling agent KBM-803 (Shinetsu Chemical Co., Ltd.), 0.5 g of epoxy silane coupling agent KBM-303 (Shinetsu Chemical Co., Ltd.), 20 g of amorphous silica fillers OX-50 (Degussa), 8 g of inherent adhesive binder CA-100, and 0.1 g of IC-184 (Ciba-Geigy), the mixture was primarily dispersed at 500 rpm for about 2 hours, followed by milling the mixture.

After milling, the obtained reactant was coated to 10 μm on one side of a 38 μm PET release film SRD-T38 (Saehan Media Co., Ltd.) using an applicator, and dried at 80° C. for 2 minutes. After lamination on the 38 μm PET release film SRD-T38 (Saehan Media Co., Ltd.) at 80° C., the resultant was subjected to aging at room temperature for three days, thereby preparing a first insulation bonding layer B-1.

Preparation of a Second Insulation Bonding Layer C-1

After preparing a mixture using 150 g of acrylic resin SG-80H (weight average molecular weight of 350,000, Tg of 7.5° C., Nagasechemtech Co., Ltd.), 150 g of cresol novolac epoxy resin YDCN-500-90P (molecular weight of 10,000 or less, Kukdo Chemical Co., Ltd.), 20 g of cresol novolac curing agent MEH-7800SS (Maywa Plastic Industries Co., Ltd.), 0.8 g of imidazole curing accelerator 2P4MZ (Shikoku Chemical Industries Co., Ltd.), 0.4 g of epoxy silane coupling agent KBM-303 (Shinetsu Chemical Co., Ltd.), and 40 g of amorphous silica fillers OX-50 (Degussa), the mixture was primarily dispersed at 500 rpm for about 2 hours, followed by milling the mixture.

After milling, the obtained reactant was coated to 10 μm on one side of a 38 μm PET release film SRD-T38 (Saehan Media Co., Ltd.) using an applicator, and dried at 80° C. for 2 minutes. After lamination on the 38 μm PET release film SRD-T38 (Saehan Media Co., Ltd.) at 80° C., the resultant was subjected to aging at room temperature for three days, thereby preparing a second insulation bonding layer C-1.

Preparation of a Bonding Film D-1

The prepared adhesive layer A-1, the first insulation bonding layer B-1, and the second insulation bonding layer C-1 were sequentially laminated using a laminator, thereby fabricating a bonding film D-1.

Comparative Example 1

Preparation of an Adhesive Layer a-1

After preparing a mixture with 100 g of acrylic adhesive binder AT-2842 (weight average molecular weight of 600,000, Tg of −50° C., Samwon Chemicals Co., Ltd.) and 80 g of 6 functional urethane acrylate U-324A (Shinnakamura Co., Ltd.), 1 g of polyisocyanate curing agent L-45 (Nippon Polyurethane Co., Ltd.) and 1.8 g of IC-184 (available from Ciba-Geigy Ltd.) were added to the mixture, thereby preparing a UV-curable adhesive composition. Then, the UV-curable adhesive composition was coated to 10 μm on one side of a 38 μm PET release film SRD-T38 (Saehan Media Co., Ltd.) using an applicator, and dried at 80° C. for 2 minutes. Then, after lamination on a 100 μm PO film OD-100 (Riken Technos, Ltd.) at 60° C., the UV-curable adhesive composition was subjected to aging at 40° C. for three days in an oven, thereby preparing an adhesive layer a-1.

Except for the adhesive layer a-1, a first insulation bonding layer B-1 and a second insulation bonding layer C-1 were prepared by the same method as that of Example 1. Then, the prepared adhesive layer a-1, the first insulation bonding layer B-1, and the second insulation bonding layer C-1 were sequentially laminated using a laminator, thereby fabricating a bonding film d-1.

Comparative Example 2

Comparative Example 2 was prepared by the same method as that of Example 1 except that Comparative Example 2 did not use the UV curing agent (photo initiator) IC-184 in preparation of the first bonding layer.

Comparative Example 3

Preparation of a Second Insulation Bonding Layer c-1

After preparing a mixture using 150 g of acrylic resin KLS-1045 (weight average molecular weight of 750,000, Tg of 30° C., Huzikura Co., Ltd.), 150 g of cresol novolac epoxy resin YDCN-500-90P (molecular weight of 10,000 or less, Kukdo Chemical Co., Ltd.), 20 g of cresol novolac curing agent MEH-7800SS (Maywa Plastic Industries Co., Ltd.), 0.8 g of imidazole curing accelerator 2P4MZ (Shikoku Chemical Industries Co., Ltd.), 0.4 g of epoxy silane coupling agent KBM-303 (Shinetsu Chemical Co., Ltd.), and 40 g of amorphous silica fillers OX-50 (Degussa), the mixture was primarily dispersed at 500 rpm for about 2 hours, followed by milling the mixture.

After milling, the obtained reactant was coated to 10 μm on one side of a 38 μm PET release film SRD-T38 (Saehan Media Co., Ltd.) using an applicator, and dried at 80° C. for 2 minutes. After lamination on the 38 μm PET release film SRD-T38 (Saehan Media Co., Ltd.) at 80° C., the resultant was subjected to aging at room temperature for three days, thereby preparing a second insulation bonding layer c-1.

Except for the second insulation bonding layer c-1, an adhesive layer A-1 and a first insulation bonding layer B-1 were prepared by the same method as that of Example 1. Then, the prepared adhesive layer A-1, the first insulation bonding layer B-1, and the second insulation bonding layer c-1 were sequentially laminated using a laminator, thereby fabricating a bonding film d-3.

Comparative Example 4

Preparation of a Single Bonding Layer c-2

After preparing a mixture using 150 g of acrylic resin WS-023 (hydroxyl value or acid value of 20 mgKOH/g, Tg of −5° C., average molecular weight of 500,000, OH or COOH content of 20, Nagasechemtech Co., Ltd.), 150 g of cresol novolac epoxy resin YDCN-500-90P (molecular weight of 10,000 or less, Kukdo Chemical Co., Ltd.), 20 g of cresol novolac curing agent MEH-7800SS (Maywa Plastic Industries Co., Ltd.), 0.8 g of imidazole curing accelerator 2P4MZ (Shikoku Chemical Industries Co., Ltd.), 0.4 g of epoxy silane coupling agent KBM-303 (Shinetsu Chemical Co., Ltd.), and 40 g of amorphous silica fillers OX-50 (Degussa), the mixture was primarily dispersed at 500 rpm for about 2 hours, followed by milling the mixture.

After milling, the obtained reactant was coated to 10 μm on one side of a 38 μm PET release film SRD-T38 (Saehan Media Co., Ltd.) using an applicator, and dried at 80° C. for 2 minutes. After lamination on the 38 μm PET release film SRD-T38 (Saehan Media Co., Ltd.) at 80° C., the resultant was subjected to aging at room temperature for three days, thereby preparing a single bonding layer c-2.

Except for the single bonding layer c-2, an adhesive layer A-1 was prepared by the same method as that of Example 1. Then, the prepared adhesive layer A-1 and the single bonding layer c-2 were sequentially laminated using a laminator, thereby fabricating a bonding film d-4.

Properties of the bonding films D1, d1, d2, d3 and d4 of Example 1 and Comparative Examples 1~4 were evaluated as follows.

Test for Evaluating Properties of Bonding Films
① Back Grinding Properties of Wafer (BG)
With each of the bonding films of Example 1 and Comparative Examples 1-4 mounted on a 720 μm wafer by a back-lap device, the back sides of the wafers were ground to a depth of 80 μm. Results of the test were determined as follows.
No damage and no micro crack on wafer O
Damage and micro crack on wafer X
② 180 Degree Average Peeling Force (PF) Between Adhesive Layer and First Insulation Bonding Layer (Before and after UV Curing)
A 180 degree average peel test was performed according to JIS Z0237.

After UV irradiation to samples obtained from the bonding films of Example 1 and Comparative Examples 1-4, each of the samples was cut to a size of 25 mm×150 mm.

An interface between the adhesive layer and the first insulation bonding layer of each sample was separated using a pair of tweezers. Then, the sample was clamped between upper and lower jigs of Instron Series IX/s Automated Materials Tester-3343 with a 10 N load cell, and was peeled off at a pulling rate of 300 mm/min to measure load for peeling.

UV irradiation was performed at an intensity of 300 mJ/cm$^2$ by irradiating UV rays from a high voltage mercury lamp having an illumination intensity of 70 W/cm for 3 seconds using DS-MUV128-S1 (Daesung Engineering Co., Ltd.). The 180 degree average peeling forces of 5 samples were measured before and after the UV irradiation.

③ Peeling Characteristics (PC) of Adhesive Layer and Base Film

After removing protective films from the bonding films of Example 1 and Comparative Examples 1-4, each of the bonding films was mounted on one side of an 8-inch wafer at 60° C. using Mounter AR-08WM available from Aaron Co., Ltd.

Then, an acryl bonding tape (Seotong OPP Tape) of 25 mm×300 mm was thermally compressed to a base film plane of the wafer, to which the bonding film was attached. (Here, only 200 mm of the bonding tape having a length of 300 mm was compressed.)

UV irradiation was performed at an intensity of 300 mJ/cm$^2$ by irradiating UV rays from a high voltage mercury lamp having an illumination intensity of 70 W/cm for 3 seconds using DS-MUV128-S1 (Daesung Engineering Co., Ltd.).

Then, the wafer and the bonding tape were clamped between the upper and lower jigs of Instron Series IX/s Automated Materials Tester-3343 with a 10 N load cell, and were peeled off at a pulling rate of 1500 mm/min. After peeling, a torn state or a released state of the first insulation bonding layer 4 was observed.

No tear, no release and no extension of the first insulation bonding layer—O
Tear, release or extension of the first insulation bonding layer—X
④ Mounting Void, Chipping, and Chip Crack
After mounting the bonding films of Example 1 and Comparative Examples 1-4 to the surface of an 8-inch 80 μm thick wafer having bumps thereon through thermal compression with Mounter AR-08WM available from Aaron Co., Ltd, a void state of the surface was observed using ME600L available from Nikon Co., Ltd.

Then, the wafer was cut into 100 chips having a size of 10.0 mm×10.0 mm using DFD-650 (Disco Co., Ltd.), and chipping and chip cracks on the surfaces and cross-sections of the chips were observed.
No void, no chipping and no chip crack—O
Void, chipping or chip crack—X
⑤ Storage Modulus (SM)
After cutting the second insulation bonding layer of each of the bonding films obtained from Example 1 and Comparative Examples 1-4 to a size of 200 μm thickness×7 mm width×14 mm length, the storage modulus was measured while raising temperature at a rate of 4° C./min from −10° C. to 150° C. In this test, data of 60° C. was adopted.
⑥ Bonding Force Between Chips (Die Shear Strength) (DSS)
After cutting a 525 μm thick wafer coated with a dioxide layer to a size of 5 mm×5 mm, only the first and second insulation layers were laminated to the wafer at 60° C. and were cut off except for bonded parts thereof.

After attaching the wafer pieces having the bonding parts laminated thereon to a wafer of 525 μm thickness×10 mm width×10 mm length placed on a hot plate at 120° C., the wafer pieces were compressed onto the wafer for 20 seconds at 500 gf, followed by curing at 125° C. for two hours and at 175° C. for four hours.

Then, the bonding force between chips was measured at 250° C. and a shear rate of 100 μm/sec using a shear strength tester Dage-100.

Table 1 shows test results of Example 1 and Comparative Examples (C.E.) 1-4.

TABLE 1

| Items | | Unit | Example 1 | C.E. 1 | C.E. 2 | C.E. 3 | C.E. 4 |
|---|---|---|---|---|---|---|---|
| BG | | — | ○ | ○ | ○ | ○ | ○ |
| PF | Before UV | N/25 mm | 1.29 | 1.45 | 1.33 | 1.28 | 1.38 |
| | After UV | | 0.04 | 0.87 | 0.18 | 0.06 | 0.20 |
| PC | | — | ○ | X | X | ○ | X |
| void, chipping, crack | | — | ○ | ○ | ○ | X | ○ |
| SM | | MPa | 3.2 | 2.4 | 3.7 | 22.8 | 5.4 |
| DSS | | Kgf | 12 | 11 | 13 | 12 | 11 |

The adhesive layer of Example 1 was prepared using the inherent adhesive binder to improve the peeling characteristics. Further, Example 1 had two bonding layers, in which the first insulation bonding layer contained the UV-curable polymer and had a peeling force of about 0.1 N/25 mm or less (0.04 N/25 mm) with respect to the adhesive layer after UV irradiation. Therefore, it may be seen from Table 1 that the first insulation bonding layer was easily peeled from the adhesive layer by the reel-shaped bonding tape after back grinding.

Further, the second insulation bonding layer of Example 1 was prepared using the acrylic binder having a glass transition temperature of about −20 to about 20° C. It had a storage modulus of 3.2 MPa at 60° C. and did not exhibit mounting voids, chipping, chip cracks, or the like.

When bonding the chips using the bonding tape of Example 1, the bonding force between the chips was about 12 kgf.

The adhesive layer of Comparative Example 1 was prepared using the mixture composition instead of the inherent adhesive binder. The peeling force between the adhesive layer and the first insulation bonding layer after UV irradiation was 0.87 N/25 mm. As a result, when peeling the first insulation bonding film from the adhesive layer using the reel-shaped bonding tape after back grinding, the first insulation bonding film was torn.

In Comparative Example 2, the adhesive layer and the second insulation bonding layer were the same as those of Example 1, but the first insulation bonding layer did not contain the UV-curable compound.

In Comparative Example 2, the peeling force between the adhesive layer and the first insulation bonding layer was decreased to 0.18 N/25 mm after UV irradiation. However, this peeling force was not sufficient to allow the first insulation bonding layer to be peeled from the adhesive layer by the reel-shaped bonding tape after back grinding. Thus, the surface of the first insulation bonding film became released.

In Comparative Example 3, the adhesive layer and the first insulation bonding layer were the same as those of Example 1, but the second insulation bonding layer was prepared using the binder having a glass transition temperature of 30° C.

The second insulation bonding layer of Comparative Example 3 had a storage modulus of 22.8 MPa at 60° C. and did not completely fill up the roughness on the wafer, which had the bumps formed thereon. As a result, voids were formed on the wafer surface, thereby causing chipping and chip cracks near the voids during dicing.

Comparative Example 4 was prepared using a single bonding layer instead of double bonding layers. However, the peeling force between the adhesive layer and the bonding layer after UV irradiation was 0.20 N/25 mm, and thus, the bonding layer was not peeled from the adhesive layer by the reel-shaped bonding tape after back grinding.

As describe above, a MCP or WSP method may be sued as a packaging technique. Both the MCP method and the WSP method may increase the capacity of the semiconductor device in view of quantity by bonding plural chips with a bonding agent and laminating the chips on top of each other. In the MCP method, the chips may be electrically connected to each other by wire bonding. Thus, each of the chips may have an open circuit-formed side and may have a bonding agent applied to an opposite side (e.g., a backside ground side) thereof to connect the chips to each other.

Therefore, the MCP method may utilize a separate adhesive tape, which may be provided to the circuit-formed side only during a back grinding process. Then, a dicing process and a pick-up/die-attachment process may be performed after attaching a tape, which may have an adhesive layer and a bonding layer, to the opposite side (ground side) of the chip to the circuit-formed side.

In other words, the adhesive tape for use in the back grinding process may not provide other functions except for its use during the back grinding process.

On the other hand, in the WSP method, the chips may be connected to each other via the through-electrodes instead of wire bonding. Thus, the bonding agent may be applied to the circuit-formed side of the chip to connect the chips with each other.

Accordingly, the WSP method may utilize a tape that is able to be used not only during the back grinding process but also during both the dicing process and the pick-up/die-attachment process, instead of the tape that may be used only during the back grinding process.

According to the embodiments, the multifunction tape for a semiconductor package may include the adhesive layer, the first insulation bonding layer, the second insulation bonding layer, and the protective film. In the multifunction tape of the embodiments, the adhesive layer may include an adhesive binder where a UV-curable carbon-to-carbon double bond is provided to a side chain of a polymer adhesive binder.

The first insulation bonding layer may be formed by mixing about 0.1 to about 10 parts by weight of a UV-curable polymer having the carbon-to-carbon double bond with 100 parts by weight of acrylic resin, epoxy resin, and a curing accelerator. The first insulation bonding layer may have a 180 degree average peeling force of about 0.1 N/25 mm or less with respect to the adhesive layer after UV irradiation.

The second insulation bonding layer may include about 30 to about 70 parts by weight of acrylic resin with respect to 100 parts by weight of other components in the second insulation bonding layer, in which the acrylic resin has a glass transition temperature of about −20 to about 20° C. The multifunction tape including these components may be used for a semiconductor package. For example, the multifunction tape of the embodiments may facilitate consistent performance of a back grinding process and a die-attachment process without a separate tape.

As apparent from the above description, according to the embodiments, the multifunction tape for a semiconductor package may be commonly used during a rear-side grinding process, a dicing process, and/or a pick-up/die-attachment process during the processes. The multifunction tape may include a first bonding layer between an adhesive layer and a second bonding layer and the first bonding layer may include a UV-curable agent to be cured along with the adhesive layer by UV irradiation, thereby significantly enhancing peeling characteristics of the adhesive layer.

Further, the multifunction tape according to the embodiments may facilitate consistent performance of the back grinding process and the pick-up/die-attachment process without other bonding tapes. Furthermore, the back grinding process, the dicing process, and the pick-up/die-attachment process may also be consistently performed only with the multifunction tape of the embodiments.

Embodiments provide a multifunction tape for semiconductor packaging, which facilitates consistent performance of a back-grinding process, a dicing process and/or a pickup-die attaching process using a single multifunction tape in a WSP process.

Embodiments also provide a multifunction tape for a semiconductor package, which can be commonly used during a rear-side grinding process, a dicing process, and/or a pickup/die-attachment process in a WSP method.

According to the embodiments, the multifunction tape may include a first bonding layer containing a UV curing agent in an interface between the adhesive layer and the second bonding layer so that the first bonding layer may be hardened along with the adhesive layer during UV curing, thereby significantly improving peeling characteristics of the adhesive layer.

This multifunction tape allows the back-grinding process and the pickup-die attaching process to be consistently performed using a single tape. Moreover, the multifunction tape allows the back-grinding process, dicing process and pickup-die attaching process to be consistently performed using a single tape.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multifunction tape for a semiconductor package and configured to bond to a device-formed side of a semiconductor substrate having a plurality of devices thereon while performing a process of grinding a side of the semiconductor substrate opposite to the device-formed side and a process of dicing the semiconductor substrate into individual chips with a dicing tape having a UV-curable adhesive layer bonded to the ground side of the semiconductor substrate, the multifunction tape being bonded to the individual chips while the individual chips, separated from each other by the dicing process, are picked up and die-attached, the multifunction tape comprising:
   a base film;
   a UV-curable adhesive layer on one side of the base film; and
   first and second bonding layers on the adhesive layer.

2. The multifunction tape as claimed in claim 1, wherein the first bonding layer is interposed between the adhesive layer and the second bonding layer, the first bonding layer including a UV-curable material configured to improve peeling characteristics with respect to the adhesive layer and the second bonding layer after UV irradiation.

3. The multifunction tape as claimed in claim 1, wherein the first bonding layer has a 180 degree average peeling force of about 0.1 N/25 mm or less with respect to the adhesive layer after UV irradiation.

4. The multifunction tape as claimed in claim 1, wherein the first and second bonding layers are thermosetting layers.

5. The multifunction tape as claimed in claim 1, wherein the second bonding layer has a storage modulus of about 0.1 to about 10 MPa at 60° C.

6. A multifunction tape for a semiconductor package and configured to bond to a device-formed side of a semiconductor substrate having a plurality of devices thereon while performing a process of grinding a side of the semiconductor substrate opposite to the device-formed side and a process of dicing the semiconductor substrate into individual chips, the multifunction tape being bonded to the individual chips while the individual chips, separated from each other by the dicing process, are picked up and die-attached, the multifunction tape comprising:
   a base film;
   a UV-curable adhesive layer on one side of the base film; and
   first and second bonding layers on the adhesive layer.

7. The multifunction tape as claimed in claim 6, wherein the first bonding layer is interposed between the adhesive layer and the second bonding layer, the first bonding layer including a UV-curable material configured to improve peeling characteristics with respect to the adhesive layer and the second bonding layer after UV irradiation.

8. The multifunction tape as claimed in claim 6, wherein the first bonding layer has a 180 degree average peeling force of about 0.1 N/25 mm or less with respect to the adhesive layer after UV irradiation.

9. The multifunction tape as claimed in claim 6, wherein the first and second bonding layers are thermosetting layers.

10. The multifunction tape as claimed in claim 6, wherein the second bonding layer has a storage modulus of about 0.1 to about 10 MPa at 60° C.

11. A method of fabricating a semiconductor device, the method comprising:
   bonding a multifunction tape to a device-formed side of a semiconductor substrate, the multifunction tape including a base film, a UV-curable adhesive layer on one side of the base film, and first and second bonding layers on the adhesive layer;
   grinding a side of the semiconductor substrate opposite to the device-formed side;
   bonding a dicing tape to the ground side of the semiconductor substrate;
   dicing the semiconductor substrate into individual chips;
   picking up the individual chips with the first and second bonding layers bonded thereto; and
   die-attaching the individual chips using the first and second bonding layers.

12. The method as claimed in claim 11, further comprising irradiating UV rays to the multifunction tape after dicing the semiconductor substrate and prior to picking up the chips.

13. The method as claimed in claim 11, further comprising increasing a separation between respective individual chips by expanding the dicing tape prior to picking up the individual chips.

14. A method of fabricating a semiconductor device, the method comprising:
   bonding a multifunction tape to a device-formed side of a semiconductor substrate, the multifunction tape including a base film, a UV-curable adhesive layer on one side of the base film, and first and second bonding layers on the adhesive layer;
   grinding a side of the semiconductor substrate opposite to the device-formed side;
   dicing the semiconductor substrate into individual chips;
   picking up the individual chips with the first and second bonding layers bonded thereto; and
   die-attaching the individual chips using the first and second bonding layers.

15. The method as claimed in claim 14, further comprising irradiating UV rays to the multifunction tape after dicing the semiconductor substrate and prior to picking up the individual chips.

16. The method as claimed in claim 14, further comprising increasing a separation between respective individual chips by expanding the multifunction tape prior to picking up the individual chips.

* * * * *